(12) United States Patent
Loke et al.

(10) Patent No.: US 7,486,167 B2
(45) Date of Patent: Feb. 3, 2009

(54) CROSS-COUPLED INDUCTOR PAIR FORMED IN AN INTEGRATED CIRCUIT

(75) Inventors: Alvin Leng Sun Loke, Fort Collins, CO (US); Philip Wilfred Fisher, Fort Collins, CO (US); Robert James Martin, Timnath, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 124 days.

(21) Appl. No.: 11/210,989

(22) Filed: Aug. 24, 2005

(65) Prior Publication Data
US 2007/0052511 A1 Mar. 8, 2007

(51) Int. Cl.
*H01F 5/00* (2006.01)
(52) U.S. Cl. .................................. 336/200
(58) Field of Classification Search .......... 336/65, 336/83, 200, 232
See application file for complete search history.

(56) References Cited

U.S. PATENT DOCUMENTS

| 5,572,179 | A | 11/1996 | Ito et al. |
| 6,380,835 | B1 | 4/2002 | Lee |
| 6,512,422 | B2 | 1/2003 | Dufour et al. |
| 6,894,598 | B2 | 5/2005 | Heima |
| 2003/0146816 | A1* | 8/2003 | Furumiya et al. ........... 336/200 |
| 2004/0108935 | A1 | 6/2004 | Kyriazidou |

FOREIGN PATENT DOCUMENTS

GB 2405040 2/2005

OTHER PUBLICATIONS

The Power of Mutual Inductance, by Andy Chow, Chief Design Engineer J.W. Miller Magnetics, publication date unknown.

* cited by examiner

*Primary Examiner*—Tuyen T. Nguyen

(57) ABSTRACT

Cross-coupled first and second helical inductors formed in an IC. The cross-coupled first and second helical inductors comprise a first helical conductor having a first portion and a second portion, and a second helical conductor having a first portion and a second portion. The second helical conductor is in close proximity to the first helical conductor. The first helical inductor is formed by the first portion of the first helical conductor and the second portion of the second helical conductor. The second helical inductor is formed by the second portion of the first helical conductor and the first portion of the second helical conductor.

6 Claims, 6 Drawing Sheets

CROSS-COUPLED INDUCTOR PAIR FORMED IN AN INTEGRATED CIRCUIT

BACKGROUND OF THE INVENTION

Differential resonant (i.e., inductor/capacitor (LC)-based) oscillators are increasingly being used to perform low-jitter frequency synthesis in integrated circuit (IC) systems. This trend has been made possible as a result of the relatively recent feasibility of implementing inductors monolithically with good quality factor, Q, using interconnect wiring metal layers. In qualitative terms, Q of a resonant system is the ratio of the total energy in a system to the energy lost per cycle. FIG. 1 illustrates a block diagram of a resonant oscillator circuit 1 having a pair of resonant LC tanks 2 and 3 that consist of ideally identical inductors 4 and 5 and variable capacitors 6 and 7. Each resonant tank oscillates differentially with respect to the other tank at a frequency, $f=½π(LC)^{0.5}$, where L is the value of the inductance of the tank inductor and C is the value of the capacitance of the tank variable capacitor. Cross-coupled gain transistors 8 and 9 periodically replenish energy into the tanks 2 and 3 to sustain oscillations that would otherwise decay and disappear due to parasitic resistive losses in the inductors and capacitors. Tunable output frequencies are typically generated by modulating the capacitance of the variable capacitors 6 and 7 using some control voltage, $V_{control}$.

FIG. 2 illustrates a perspective view of a known planar spiral inductor 11 formed in an IC using a single layer of interconnect metal to form, for example, three turns 12, 13 and 14. The first turn 12 of the inductor 11 starts at end 15 and the third turn 14 ends at end 16, which is interconnected to a feed 17 by vias 18 and 19 and underpass element 20. Such inductors can be built to exhibit a relatively good quality Q due to the fact that the physical separation between the highest interconnect level, which is typically where the inductor is formed, and the semiconductor substrate below ensures that minimal energy will be dissipated as a result of eddy currents being magnetically induced in the substrate. However, because of weak mutual magnetic coupling between inductor windings, these inductors typically need to be extremely large in order to achieve a target self-inductance, and thus consume a large area in the IC, making implementation rather expensive.

It is known to create a differential resonant oscillator in an IC by using a pair of the planar spiral inductors shown in FIG. 2 to achieve a circuit design of the type shown in FIG. 1. In differential resonant oscillators, the mutual inductive coupling between the two planar spiral inductors is usually tailored to provide very strong magnetic coupling between the two inductors. Strong magnetic coupling between the inductors mitigates problems that may occur due to asymmetries and mismatches between the left and right resonant tanks that occur during IC manufacturing. Strong coupling can also prevent undesirable nonlinear effects that may cause the left tank to behave in a non-differential fashion from the right tank. Without strong coupling, the two resonant tanks can oscillate independent of each other in a non-differential fashion.

The coupling of the two tanks through the negative impedance generator (i.e., the cross-coupled gain transistors 8 and 9) is typically insufficient to eliminate the effects caused by tank asymmetries. One such effect is the left tank oscillating with a different voltage amplitude and non-180° phase alignment from the right tank due to large voltage amplitude oscillations about typically very nonlinear capacitance-versus-control-voltage characteristics of the variable tuning capacitors 6 and 7. Such instabilities can produce undesirable oscillator output jitter.

One known practical way of tightly coupling the two tanks is implementing strong magnetic coupling of the spiral planar inductors of a differential resonant oscillator through cross-coupling of the inductors. FIG. 3 illustrates a perspective view of a cross-coupled pair 21 of planar spiral inductors 22 and 23. For ease of illustration, each inductor is shown as having a single turn. Inductor 23 is cross-coupled with inductor 22 by vias 24 and 25 and cross-coupling element 26.

Although tight mutual coupling can be achieved with the cross-coupled planar inductor pair 21 shown in FIG. 3, the inductor pair 21 consumes a relatively large amount of area on the die. Since die cost is commensurate with area, area can be a significant impediment to practical implementation of certain circuit architectures and applications. Moreover, the orientation of the turns of the inductors 22 and 23 is such that there is very strong negative magnetic coupling. When the differential nature of the left and right tank oscillations is taken into account, the polarity of this net negative coupling will be flipped to yield net additive magnetic linkage between the two inductors 22 and 23 and the substrate. This linkage can lead to energy being dissipated as a result of eddy currents being magnetically induced in the substrate and lower the inductor Q.

In addition, the resulting orientation of the two planar spiral inductors 22 and 23 creates another key drawback. When the right-hand rule is applied to determine the orientation of the magnetic flux lines, it becomes apparent that the magnetic fields from the differentially driven inductors are additive as they penetrate through the substrate and surrounding vicinity of the inductors. This will induce noise through eddy current generation, which can limit the number of resonant oscillators that can be monolithically integrated in a single IC die.

A need exists for an inductor pair formed on an IC that has strong mutual magnetic coupling between the inductors, that has low energy loss due to eddy currents being generated in the IC substrate, and that consumes a small amount of area on the IC die.

SUMMARY OF THE INVENTION

The invention provides cross-coupled first and second helical inductors formed in an IC. The cross-coupled first and second helical inductors comprise a first helical conductor having a first portion and a second portion, and a second helical conductor having a first portion and a second portion. The second helical conductor is in close proximity to the first helical conductor. The first helical inductor is formed by the first portion of the first helical conductor and the second portion of the second helical conductor. The second helical inductor is formed by the second portion of the first helical conductor and the first portion of the second helical conductor.

The invention also provides a method for generating magnetic coupling in an IC. The method comprises passing an electrical current through first and second helical inductors that are in close proximity to one another. Each inductor has at least a first helical conductor having a first portion and a second portion, and a second helical conductor having a first portion and a second portion. The first helical inductor is formed by the first portion of the first helical inductor and by the second portion of the second helical conductor. The second helical conductor is formed by the second portion of the first helical conductor and by the first portion of the second helical conductor.

These and other features and advantages of the invention will become apparent from the following description, drawings and claims.

DETAILED DESCRIPTION OF THE PREFERRED EMBODIMENTS

Figure 1:
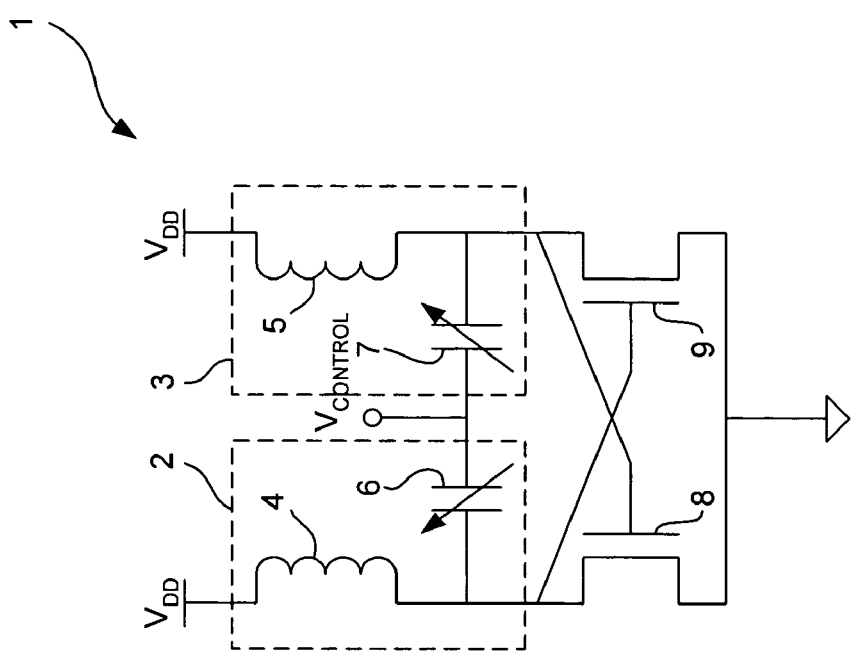
FIG. 1 illustrates a block diagram of a resonant oscillator circuit that has a pair of resonant LC tanks, each having an inductor and a variable capacitor.
Figure 2:
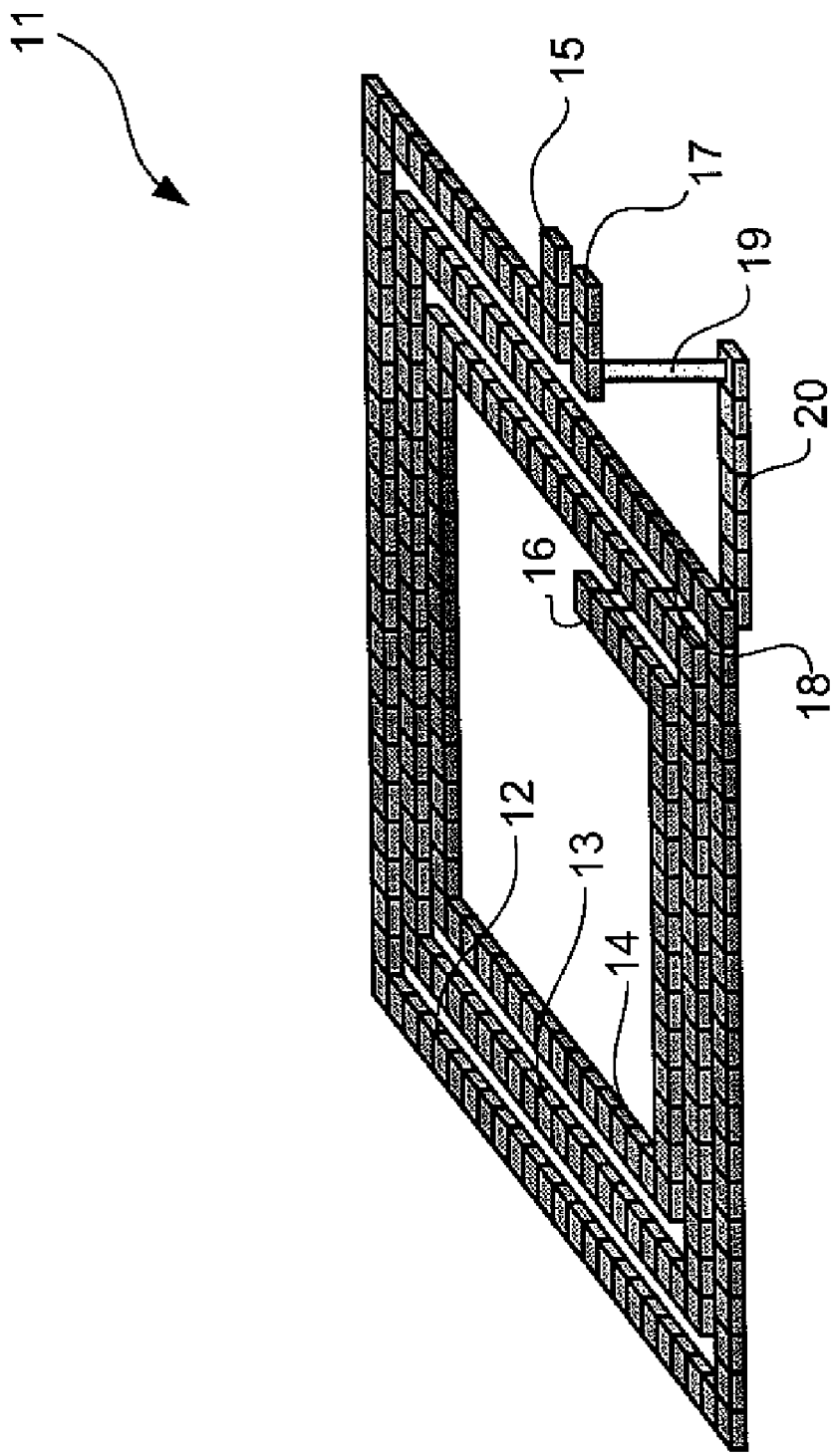
FIG. 2 illustrates a perspective view of a known planar spiral inductor formed in an IC using a single layer of interconnect metal to form three turns.
Figure 3:
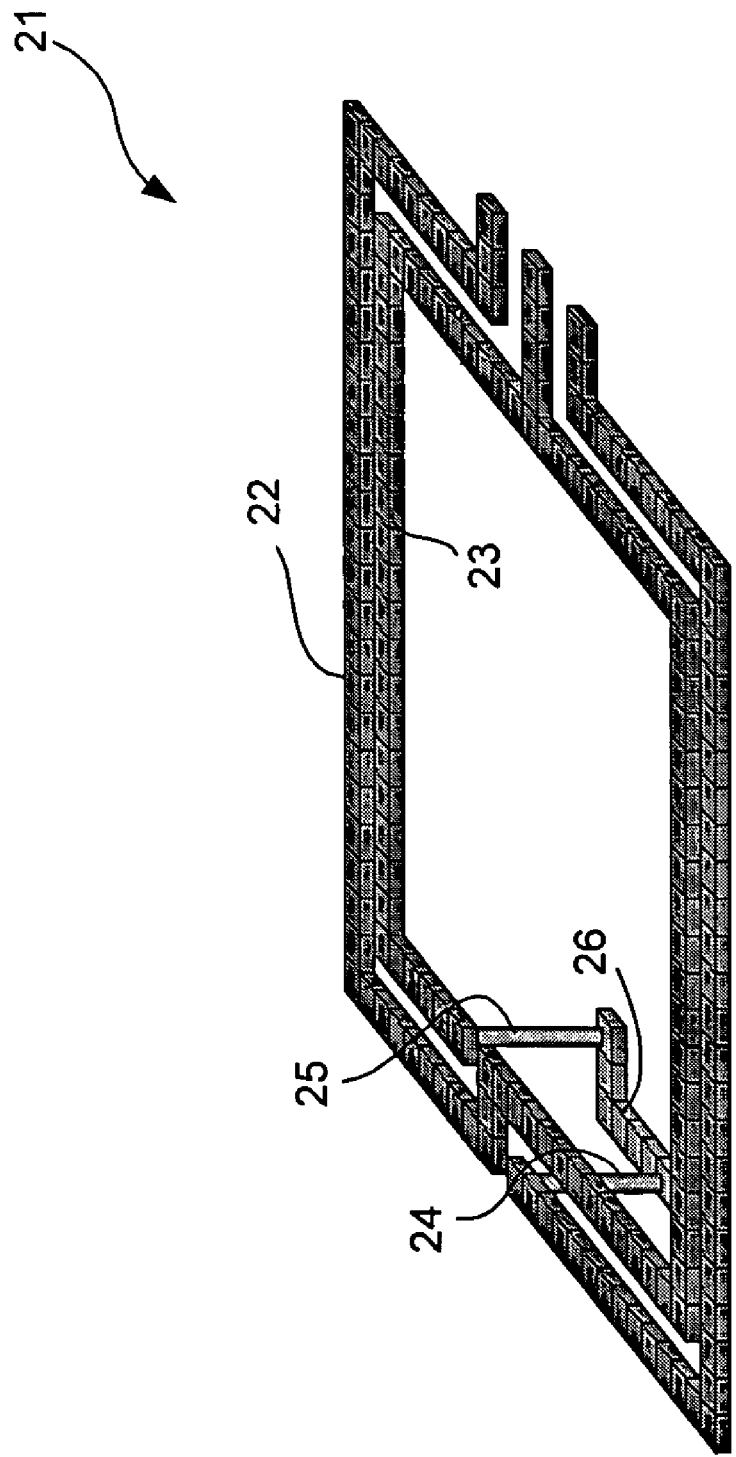
FIG. 3 illustrates a perspective view of a cross-coupled pair of planar spiral inductors.
Figure 4:
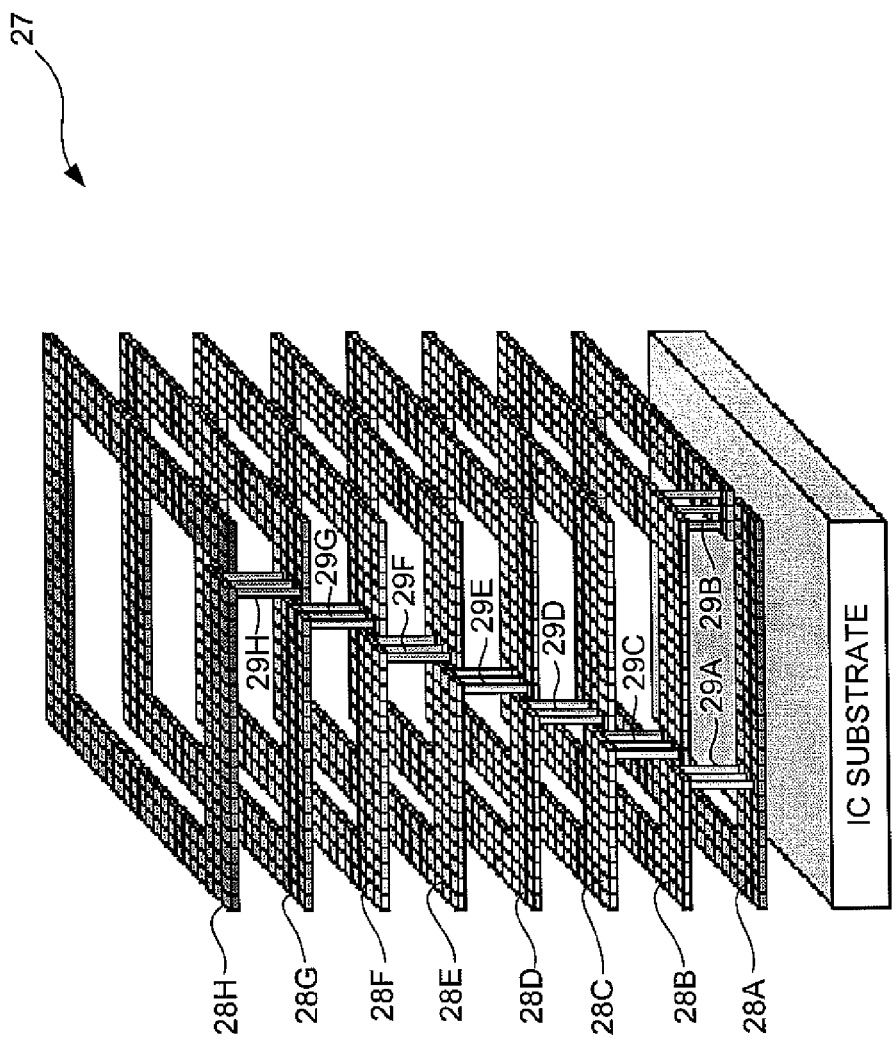
FIG. 4 illustrates a perspective view of a known helical inductor formed in an IC.

The present invention provides a pair of cross-coupled helical inductors formed in an IC that can be used in conjunction with other elements formed in the IC to produce a differential resonant oscillator circuit. FIG. 4 illustrates a perspective view of a known helical inductor 27 formed in an IC. The helical inductor 27 has turns 28A-28H that are formed in respective metal layers of the IC. The turns are interconnected by vias 29A-29H. Turns 28A and 28B are shorted together by vias 29A and 29B, respectively, such that turns 28A and 28B function as a single turn. Therefore, in this example of a known helical inductor, the inductor has seven turns. Other configurations of helical inductors that have a greater or lesser number of turns are also known.

Although it is known to construct helical inductors in ICs, planar spiral inductors are by far the most common form of inductors used in ICs due to their high Q, which reduces jitter. Helical inductors have a lower Q than planar spiral inductors, and therefore generally are more susceptible to jitter. However, in performing circuit simulations with the cross-coupled helical inductors of the invention, it was observed that the strong mutual magnetic coupling that exists between the turns of cross-coupled helical inductors eliminated undesirable nonlinear effects, which can cause the left and right resonant tanks to oscillate in a non-differential fashion, i.e., with other than a 180° phase alignment between the tanks. This tradeoff between having a high Q and maintaining the 180° phase alignment is justified under certain circumstances. In other words, there are advantages to sacrificing some Q in order to ensure that the 180° phase alignment is maintained between the inductors.

In addition, the strong mutual coupling that exists between turns of cross-coupled helical inductors of the invention enables the amount of die area needed to implement the cross-coupled helical inductors to be reduced in comparison to the amount of die area needed to implement cross-coupled planar spiral pair inductors with similar mutual coupling strength. Furthermore, the juxtaposition of the differentially driven cross-coupled helical inductors of the invention and the orientation of the cross-coupled turns reduce net magnetic field penetration into the area surrounding the inductors, the underlying semiconductor substrate in particular. Consequently, there is subtractive, rather than additive, magnetic penetration into the surrounding vicinity of the inductors in the IC, which reduces the likelihood that eddy currents will be generated in the IC substrate that will result in energy loss.

Figure 5:
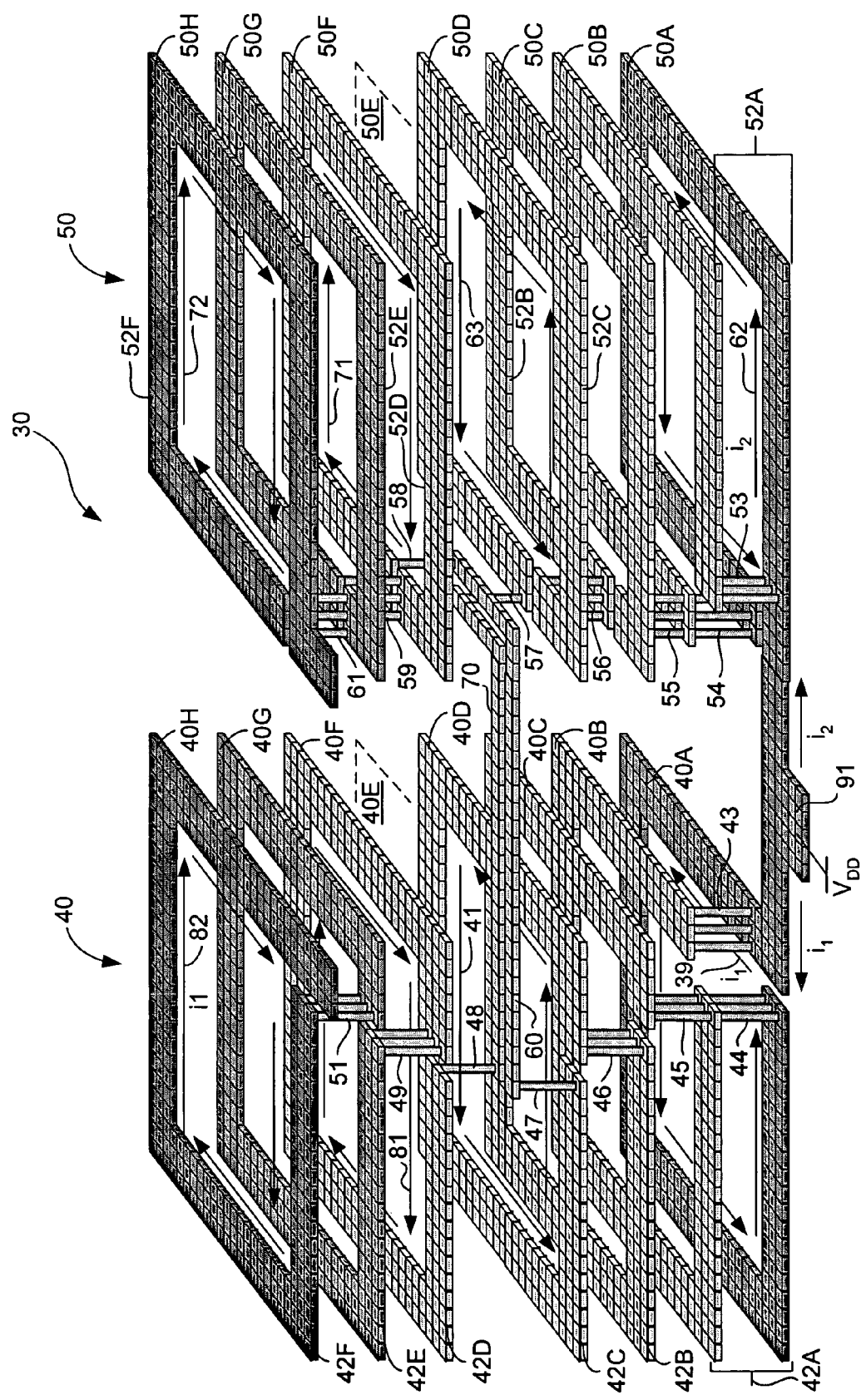
FIG. 5 illustrates a perspective view of a cross-coupled helical inductor pair of the invention in accordance with one exemplary embodiment.

FIG. 5 illustrates a perspective view of a cross-coupled helical inductor pair 30 of the invention in accordance with one exemplary embodiment. In accordance with this embodiment, the helical inductor pair 30 comprises a first inductor 40 and a second inductor 50. The inductor pair 30 is formed in eight metal layers of the IC using an eight-metal-layer IC process. Of course, the invention is not limited to any particular IC process. The invention also is not limited with respect to the number of turns that the inductors have, or with respect to the number of turns that are cross-coupled.

In the exemplary embodiment shown in FIG. 5, the inductors 40 and 50 each have six turns, although the inductors 40 and 50 each are formed in eight layers of metal. From the lowermost layer (layer one) to the uppermost layer (layer eight) of inductor 40, the layers are labeled 40A-40H, respectively. Similarly, from the lowermost layer to the uppermost layer of inductor 50, the layers are labeled 50A-50H, respectively. The vias 43-49 and 51 interconnect the layers 40A-40H of inductor 40. The vias 53-59 and 61 interconnect the layers 50A-50H of inductor 50.

A T-junction 91 that is connected to the supply voltage, $V_{DD}$, is formed in layer one. The currents, $i_1$ and $i_2$, flow in the direction shown from the T-junction to each of the inductors 40 and 50. Starting at layer one 40A of inductor 40, the current, $i_1$, flows in the counterclockwise direction, as indicated by arrow 39. The current flows through the turn 42A formed by the combination of layers one and two 40A and 40B, which are short-circuited together by vias 43 and 44. Short-circuiting layers 40A and 40B places them in parallel, which essentially halves the resistance of the turn 42A in comparison to the resistance of each of the other turns 42B-42F for higher Q. The current flowing through turn 42A flows through vias 45 into layer three 40C. The current flows through turn 42B formed in layer three 40C in the same counterclockwise direction. The current flowing through turn 42B flows through vias 46 into turn 42C formed in layer four 40D. The current flows through turn 42C formed in layer four 40D in the same counterclockwise direction, as indicated by arrow 41.

The current flowing through turn 42C flows through vias 47 into cross-coupling element 60, which cross-couples the current into inductor 50 from inductor 40. The cross-coupling element 60 is connected by vias 58 to layer 50F of inductor 50. Layer 50E is represented by dashed lines because it is not used to form a turn, but is used to form the cross-coupling elements. The current flows through turn 52D formed in layer 50F in the clockwise direction, as indicated by arrow 71. The current flowing through turn 52D flows through vias 59 into turn 52E formed in layer 50G of inductor 50. The current flows through turn 52E in the same clockwise direction and flows through vias 61 into turn 52F formed in layer 50H of inductor 50. The current flows through turn 52F formed in layer 50H in the same clockwise direction, as indicated by arrow 72.

The cross coupling of current from inductor 50 into inductor 40 will now be described. Starting at layer one 50A of inductor 50, the current, $i_2$, flows in the counterclockwise direction, as indicated by arrow 62. The current flows through turn 52A formed by the combination of layers one and two 50A and 50B of inductor 50, which are short-circuited together by vias 53 and 54. As indicated above, short-circuiting layers 50A and 50B places them in parallel, which essentially halves the resistance of the turn 52A in comparison to the resistance of each of the other turns 52B-52F. The current flowing through turn 52A flows through vias 55 into layer three 50C. The current flows through turn 52B formed in layer three 50C in the same counterclockwise direction. The current flowing through turn 52B flows through vias 56 into turn 52C formed in layer four 50D. The current flows through turn 52C formed in layer four 50D in the same counterclockwise direction, as indicated by arrow 63.

The current flowing through turn 52C flows through vias 57 into cross-coupling element 70, which cross-couples the current into inductor 40 from inductor 50. The cross-coupling element 70 is connected by vias 48 to layer 40F of inductor 40. Layer 40E is represented by dashed lines because it is not used to form a turn, but is used to form the cross-coupling elements. The current flows through turn 42D formed in layer 40F in the clockwise direction, as indicated by arrow 81. The current flowing through turn 42D flows through vias 49 into turn 42E formed in layer 40G of inductor 40. The current flows through turn 42E in the same clockwise direction and flows through vias 51 into turn 42F formed in layer 40H of inductor 40. The current flows through turn 42F formed in layer 40H in the same clockwise direction, as indicated by arrow 82.

It can be seen that a total of three of the six turns from each of the inductors 40 and 50 are cross-coupled. This provides maximum coupling for this particular inductor pair 30. As described below with reference to FIG. 6, a lesser number of turns may be cross-coupled if weaker magnetic coupling is desired, as may be the case under certain circumstances. One of the important aspects of the invention that can be noted from the above description of FIG. 5 is that the magnetic field reverses polarity when the current is cross-coupled from inductor 40 into inductor 50, and vice versa. For example, the current flows in the counterclockwise direction in turn 52C formed in layer 50D of inductor 50, but flows in the clockwise direction in turn 42D formed in layer 40F of inductor 40. Likewise, the current flows in the counterclockwise direction in turn 42C formed in layer 40D of inductor 40, but flows in the clockwise direction in turn 52D formed in layer 50F of inductor 50. In accordance with the invention, it has been determined that this orientation provides very strong mutual magnetic coupling that ensures that a 180° phase alignment is maintained between the inductors 40 and 50, i.e., that the inductors will be differentially driven. In addition, the very strong magnetic coupling achieved enables the cross-coupled helical inductor pair to consume less area on the IC than a comparable planar spiral inductor pair.

Figure 6:
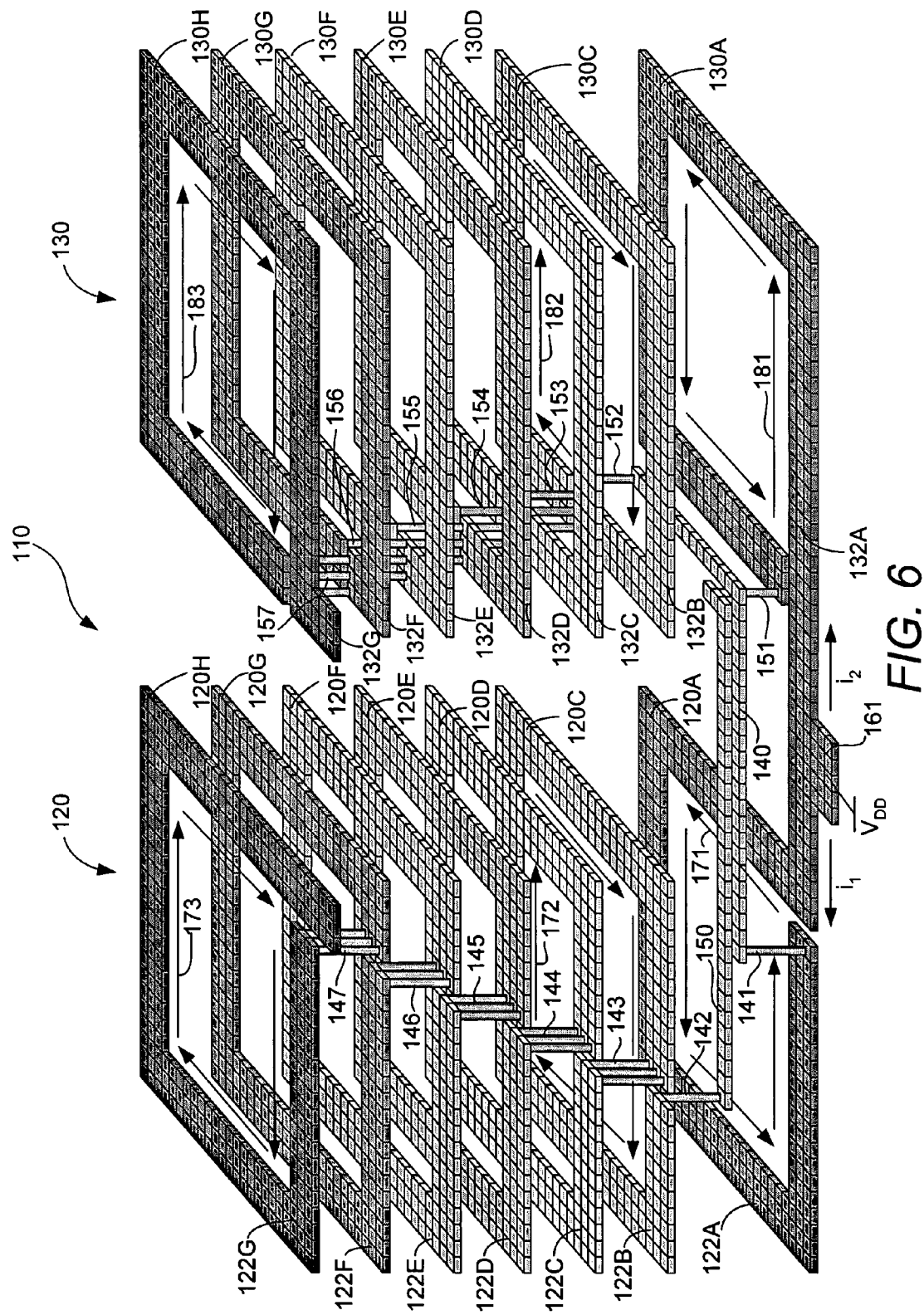
FIG. 6 illustrates a perspective view of a cross-coupled helical inductor pair of the invention in accordance with another exemplary embodiment.

FIG. 6 illustrates a cross-coupled helical inductor pair 110 in accordance with another exemplary embodiment of the invention. In accordance with this embodiment, a single turn from each inductor is cross-coupled to the other inductor. Inductor 120 is formed in eight metal layers 120A-120H. Each of the layers 120A and 120C-120H has a turn formed in it 122A-122G. The turns 122A-122G are interconnected by vias 141-147. Inductor 130 is formed in eight metal layers 130A-130H. Each of the layers 130A and 130C-130H has a turn formed in it 132A-132G. The turns 132A-132G are interconnected by vias 151-157. Layers 120B and 130B are not used to form turns, but are used instead to form the cross-coupling elements 140 and 150.

Currents, $i_1$ and $i_2$, flow in the directions indicated from the T-junction 161, which is tied to $V_{DD}$, to the turns 122A and 132A, respectively, of inductors 120 and 130, respectively. In turn 122A of inductor 120, the current flows in the counterclockwise direction, as indicated by arrow 171. The current flowing through turn 122A flows through vias 141 and into cross-coupling element 150. The current flowing through cross-coupling element 140 flows through vias 152 into turn 132B formed in layer 130C of inductor 130. The current flows through turn 132B in the clockwise direction, as indicated by arrow 182. The current flows through each of the turns 132C-132G in the same clockwise direction, as indicated by arrow 183.

In turn 132A of inductor 130, the current flows in the counterclockwise direction, as indicated by arrow 181. The current flowing through turn 132A flows through vias 151 and into cross-coupling element 150. The current flowing through cross-coupling element 150 flows through vias 142 into turn 122B formed in layer 120C of inductor 120. The current flows through turn 122B in the clockwise direction, as indicated by arrow 172. The current flows through each of the turns 132C-132G in the same clockwise direction, as indicated by arrow 173.

The weaker coupling provided by the helical inductor pair 110 shown in FIG. 6 is beneficial in circumstances where the self-resonance frequency of the inductors is a limitation. Each inductor reaches its self-resonance frequency when its inductive reactance is exactly cancelled by the net parasitic capacitance between coils and between the lowest coil and the substrate. Beyond this frequency, the inductor behaves as a capacitor and is no longer useful. To increase the self-resonance frequency of the inductor pair, the effective capacitive coupling between two adjacent turns and between the lowest turn and the substrate needs to be reduced. In understanding how to accomplish this goal, it is important to realize that there exists a gradual resistive voltage drop along the inductor. This gradual voltage drop translates into a potential difference between two adjacent turns that is only a small fraction of the total tank voltage amplitude. The effective capacitance then becomes that same fraction of the DC capacitance between these turns. The same principle can be applied to explain why the effective capacitance between the lowest turn and the substrate is also a small fraction of the DC capacitance.

Two construction details can be implemented in order to increase the self-resonance frequency. First, by reducing the number of cross-coupled turns, as in FIG. 6, the differential potential difference between the two turns from opposite inductors that face each other is reduced. In the example shown in FIG. 6, this would be capacitive coupling primarily between the turns in layers one and three. Much larger effective capacitive parasitic exists where more turns are cross-coupled, such as in FIG. 5. Second, tying the pair of inductors together at the lowest instead of highest metal level, as illustrated in FIGS. 5 and 6, significantly reduces the effective capacitive parasitic to the substrate (held at a fixed potential) because one end of each inductor is held at a fixed potential.

It should be noted that the invention has been described with reference to exemplary embodiments and that the invention is not limited to the embodiments described herein. Also, modifications can be made to the embodiments described herein and all such modifications are within the scope of the invention. Such modifications may include, for example, using a different number of turns, short-circuiting turns between adjacent metal layers, creating hybrids that incorporate planar spirals wired in a helical fashion using multiple levels of interconnect. Other modifications will be apparent to those skilled in the art in view of the description provided herein.

Also, the invention is not limited to resonant oscillators and may find application in other circuits, such as, for example, circuits that may benefit from tight mutual coupling. Examples of such circuits include RF blocks (low-noise amplifiers, mixers, and power amplifiers, etc.).

What is claimed is:

1. Cross-coupled helical inductor configuration formed in an integrated circuit (IC), the cross-coupled helical inductor configuration comprising:
a first helical inductor comprising a first plurality of conductors, wherein the conductors of said first plurality of conductors are disposed in respective layers of the IC and are conductively connected to form a first helical pattern of conductors;
a second helical inductor comprising a second plurality of conductors, wherein the conductors of said second plurality of conductors are disposed in respective layers of the IC and are conductively connected to form a second helical pattern of conductors, the first and second helical inductors being positioned in close proximity to one another in the IC;
a first coupling conductor that connects at least a first one of said first plurality of conductors to at least a first one of said second plurality of conductors; and
a second coupling element that connects at least a second one of said second plurality of conductors to a second coupling conductor to at least a second one of said second plurality of conductors.

2. The cross-coupled helical inductor configuration of claim 1, wherein if a first electrical current is introduced into said first helical inductor, the connection between said at least a first one of said first plurality of conductors and said at least a first one of said second plurality of conductors causes a first electromagnetic field to exist in a first portion of said first helical inductor and a second electromagnetic field to exist in a second portion of said second helical inductor, the first and second electromagnetic fields being oppositely directed, and wherein the oppositely directed electromagnetic fields result in reduced noise levels in a substrate of the IC.

3. The cross-coupled helical inductor configuration of claim 2, wherein if a second electrical current is introduced into said second helical inductor, the connection between said at least a second one of said first plurality of conductors and said at least a second one of said second plurality of conductors causes a third electromagnetic field to exist in a first portion of said second helical inductor and a fourth electromagnetic to exist in a second portion of said first helical inductor, the third and fourth electromagnetic fields being oppositely directed, the first and third electromagnetic fields being in a same direction and the second and fourth electromagnetic fields being in a same direction, and wherein the oppositely directed third and fourth electromagnetic fields result in reduced noise levels in the substrate of the IC.

4. A method for generating magnetic coupling in an integrated circuit (IC), the method comprising:
providing an IC having first and second helical inductors formed therein in close proximity to one another, the first helical inductor comprising a first plurality of conductors disposed in respective layers of the IC and conductively connected to form a first helical pattern of conductors, the second helical inductor comprising a second plurality of conductors disposed in respective layers of the IC and conductively connected to form a second helical pattern of conductors, at least a first one of said first plurality of conductors being connected by a first coupling conductor to at least a first one of said second plurality of conductors, at least a second one of said first plurality of conductors being connected by a second coupling conductor to at least a second one of said second plurality of conductors; and
causing first and second electrical currents to travel in the first and second helical inductors, respectively, wherein the first electrical current is electromagnetically coupled by the first coupling conductor from said first one of said first plurality of conductors into said first one of said second plurality of conductors, and wherein the second electrical current that travels in the second helical inductor is electromagnetically coupled by the second coupling conductor from said second one of said second plurality of conductors into said second one of said first plurality of conductors.

5. The method of claim 4, wherein the first electrical current causes a first electromagnetic field to exist in a first portion of said first helical inductor and a second electromagnetic field to exist in a second portion of the second helical inductor, the first and second electromagnetic fields being oppositely directed, and wherein the oppositely directed electromagnetic fields result in reduced noise levels in a substrate of the IC.

6. The method of claim 5, wherein the second electrical current causes a third electromagnetic field to exist in a first portion of said second helical conductor and a fourth electromagnetic field to exist in a second portion of said first helical inductor, the third and fourth electromagnetic fields being oppositely directed, the first and third electromagnetic fields being in a same direction and the second and fourth electromagnetic fields being in a same direction, and wherein the oppositely directed third and fourth electromagnetic fields result in reduced noise levels in the substrate of the IC.

* * * * *